United States Patent
Tsujimoto et al.

(10) Patent No.: US 9,947,818 B2
(45) Date of Patent: Apr. 17, 2018

(54) SOLAR CELL MODULE

(71) Applicant: Sanyo Electric Co., Ltd., Moriguchi, Osaka (JP)

(72) Inventors: Naoki Tsujimoto, Moriguchi (JP); Yasutoshi Mori, Moriguchi (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 250 days.

(21) Appl. No.: 13/848,267

(22) Filed: Mar. 21, 2013

(65) Prior Publication Data
US 2013/0213458 A1 Aug. 22, 2013

Related U.S. Application Data

(63) Continuation of application No. PCT/JP2011/071852, filed on Sep. 26, 2011.

(30) Foreign Application Priority Data

Sep. 28, 2010 (JP) ................................. 2010-217078

(51) Int. Cl.
*H02S 30/10* (2014.01)
*H01L 31/042* (2014.01)
(Continued)

(52) U.S. Cl.
CPC ......... *H01L 31/0424* (2013.01); *F24J 2/5211* (2013.01); *H01L 31/048* (2013.01); (Continued)

(58) Field of Classification Search
CPC .......... H01S 30/10; H01S 30/00; H01S 20/00; F24J 2/52–2/5203; F24J 2/5211; F24J 2/5262
See application file for complete search history.

(56) References Cited

U.S. PATENT DOCUMENTS 5,071,491 A * 12/1991 Stein ................. H01L 31/02008
                                                        136/244
5,252,141 A    10/1993 Inoue et al.
(Continued)

FOREIGN PATENT DOCUMENTS

JP    H5-82820 A    4/1993
JP    2000-80775 A    3/2000
(Continued)

OTHER PUBLICATIONS

Hajime Nakazawa, Takashi Koizumi, "Solid Mechanical Dynamics", 23rd edition,p. 84-89,Sep. 30, 1989, Yokendo Co. Ltd.

*Primary Examiner* — Christina Chern
(74) *Attorney, Agent, or Firm* — Metrolexis Law Group, PLLC

(57) ABSTRACT

A solar cell module includes a solar cell panel including a plurality of solar cells sealed between a front surface member and a back surface member with a sealing material, and a frame supporting a peripheral edge portion of the solar cell panel. The frame includes a main body portion, a fitting portion which is located above the main body portion and in which the peripheral edge portion of the solar cell panel is to be fitted. The frame further includes an inner flange portion provided at a part of the main body portion below the fitting portion and not below a bottom portion of the main body portion and extending in a direction inward from the peripheral edge portion of the solar cell panel.

9 Claims, 8 Drawing Sheets

(51) Int. Cl.
*H01L 31/048* (2014.01)
*F24J 2/52* (2006.01)

(52) U.S. Cl.
CPC .............. *H02S 30/10* (2014.12); *Y02E 10/47* (2013.01); *Y02E 10/50* (2013.01)

(56) References Cited

U.S. PATENT DOCUMENTS

| | | | | |
|---|---|---|---|---|
| 5,571,338 | A | * | 11/1996 | Kadonome ........... E04D 3/3608 136/251 |
| 6,105,317 | A | * | 8/2000 | Tomiuchi .................. E04D 3/08 52/173.3 |
| 8,330,037 | B2 | | 12/2012 | Furukawa |
| 2004/0084078 | A1 | * | 5/2004 | Yoshida .................. H02S 20/00 136/251 |
| 2006/0219291 | A1 | * | 10/2006 | Hikosaka ............... H02S 40/34 136/251 |
| 2008/0066801 | A1 | * | 3/2008 | Schwarze ............. F24J 2/5241 136/251 |
| 2010/0212723 | A1 | | 8/2010 | Furukawa |
| 2010/0243034 | A1 | | 9/2010 | Hu et al. |
| 2010/0243035 | A1 | * | 9/2010 | Nakamura ............ F24J 2/5211 136/251 |
| 2011/0126888 | A1 | * | 6/2011 | Naitoh .................. H01L 31/048 136/251 |

FOREIGN PATENT DOCUMENTS

| | | |
|---|---|---|
| JP | 2000-243998 A | 9/2000 |
| JP | 2001-193241 A | 7/2001 |
| JP | 2001-230440 A | 8/2001 |
| JP | 2003-282917 A | 10/2003 |
| JP | 2004-153010 A | 5/2004 |
| JP | 2009-60058 A | 3/2009 |
| JP | 3155564 U | 11/2009 |
| JP | 2010-199147 A | 9/2010 |
| WO | 2008/154980 A2 | 12/2008 |
| WO | WO 2010013691 A1 * | 2/2010 ........... H01L 31/048 |

* cited by examiner

SOLAR CELL MODULE

CROSS REFERENCE TO RELATED APPLICATIONS

This application is a continuation application of International Application No. PCT/JP2011/071852, filed on Sep. 26, 2011, entitled "SOLAR CELL MODULE", which claims priority based on Article 8 of Patent Cooperation Treaty from prior Japanese Patent Applications No. 2010-217078, filed on Sep. 28, 2010, the entire contents of which are incorporated herein by reference.

BACKGROUND OF THE INVENTION

1. Field of the Invention

This disclosure relates to a solar cell module, and particularly relates to a solar cell module including a frame.

2. Description of the Related Art

Solar cell modules configured to convert sun light into electric power and to obtain the power have been widely used in recent years. In solar cell module 1 shown in FIGS. 10 and 11, a peripheral edge of solar cell panel 10 including solar cells 11 is installed in metal frame 20 made of a metal such as an aluminum material, for the purpose of bearing various environmental loads such as a snow load and a wind pressure.

Since such solar cell module 1 ensures the strength thereof by using not only a front surface member but also frame 20, it is not necessary to make front surface member 12 thicker along with size increase in solar cell module 1, and thus is possible to suppress an increase of the weight of solar cell module 1. Further, since front surface member 12 can be made thinner, there is an advantage that an amount of light transmitted through front surface member 12 is increased to enhance power generation efficiency.

Frame 20 described above is provided with fitting portions 22 configured to support the peripheral edge of solar cell panel 10. The peripheral edge of solar cell panel 10 is fitted in groove-shaped fitting portions 22. In addition, to ensure watertightness between solar cell panel 10 and frame 20 supporting solar cell panel 10, there is proposed end face sealing member 40 which is a packing placed between panel 10 and frame 20 and made of a polypropylene based or polystyrene based elastomer resin (see Japanese Patent Application Publication No. 2004-153010, for example). End face sealing member 40 covering the peripheral edge of solar cell panel 10 is fitted in fitting portions 22 of frame 20.

Solar cell panel 10 includes solar cells 11 which are electrically connected to one another by interconnection members (not shown) made of a conductive material such as a copper foil. As shown in FIG. 11, solar cells 11 are sealed between front surface member 12 made of translucent or transparent glass or the like and back surface member 13 made of a weather resistant film or the like, by using sealing material 14 such as EVA (ethylene vinylacetate) having excellent weather resistance and moisture resistance.

SUMMARY OF THE INVENTION

As described above, the structure in which end face sealing member 40 is inserted between solar cell panel 10 and frame 20 makes it possible to ensure the watertightness between solar cell panel 10 and frame 20 supporting solar cell panel 10. Meanwhile, end face sealing member 40 and frame 20 are fixed to each other by not using an adhesive, but by only fitting face sealing member 40 in frame 20.

When being carried, solar cell module 1 is sometimes lifted while a central portion of frame 20 in a longitudinal direction of rectangular-shaped solar cell module 1 is held by a carrier. In such a case, since end face sealing member 40 is simply fitted in frame 20, frame 20 may be bent due to the weight of solar cell panel 10. The bending of frame 20 might cause solar cell panel 10 to fall off frame 20 or might cause frame 20 to be deformed.

An embodiment of the invention has been made in view of the aforementioned points, and an object thereof is to provide a solar cell module preventing frame deformation.

An aspect of the invention provides a solar cell module including: a solar cell panel in which solar cells are sealed between a front surface member and a back surface member by using a sealing material; and a frame supporting a peripheral edge portion of the solar cell panel. In the solar cell panel, the frame includes: a main body portion; a fitting portion which is located above the main body portion and in which the peripheral edge portion of the solar cell panel is to be fitted; and an inner flange portion provided at a part of the main body portion below the fitting portion and not below a bottom portion of the main body portion and extending in a direction inward from the peripheral edge portion of the solar cell panel.

According to the aspect of the invention, a second moment of area of the frame is increased. The increased second moment of area reduces an amount of displacement occurring when the central portion of the frame is held by a carrier, and thereby prevents the deformation of the frame, the falling of the solar cell panel from the frame, and the like.

DETAILED DESCRIPTION OF THE EMBODIMENTS

Figure 1:
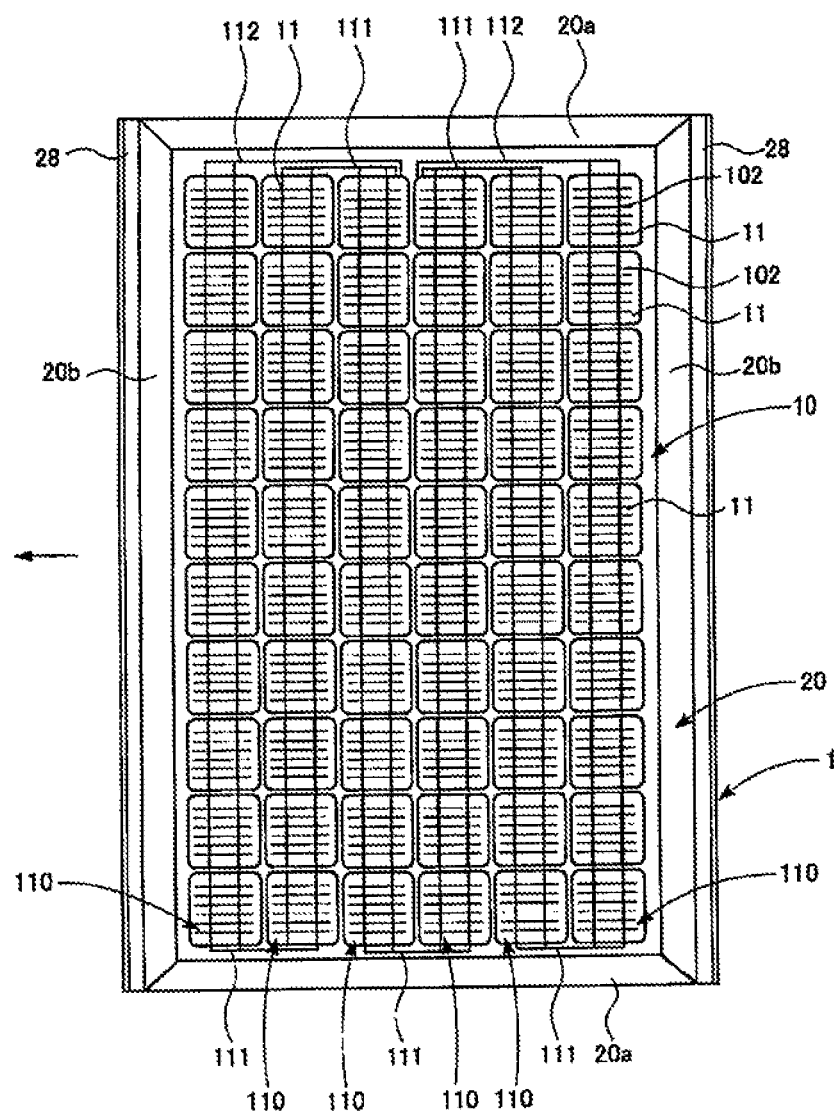
FIG. 1 is a plan view of a solar cell module according to a first embodiment.

A first embodiment is described in detail with reference to the drawings. Note that the same or equivalent components in the drawings are denoted by the same reference numerals, and a description thereof is not repeated to avoid duplicate description.

FIG. 1 is a plan view of a solar cell module according to the first embodiment. As shown in FIG. 1, solar cell module 1 of the first embodiment includes solar cell panel 10 and frame 20 supporting solar cell panel 10. Frame 20 includes a pair of first frames 20a provided on short sides of solar cell panel 10 and a pair of second frames 20b on long sides thereof. Each second frame 20b is provided with flange portion 28 protruding from a bottom of second frame 20b toward the outside of solar cell panel 10. A detailed description of flange portion 28 is described later.

First frames 20a and second frames 20b forming frame 20 are coupled to each other at endpoints in the longitudinal direction thereof. Frame 20 supports solar cell panel 10. Solar cell module 1 is attached to an installation rack (not shown) by using flange portions 28 and an engagement member (not shown).

For example, each first frame 20a has a length of approximately 800 mm to 900 mm, and each second frame 20b has a length of approximately 1300 mm to 1600 mm. However, the lengths thereof are not limited thereto, and various lengths may be used.

Figure 2:
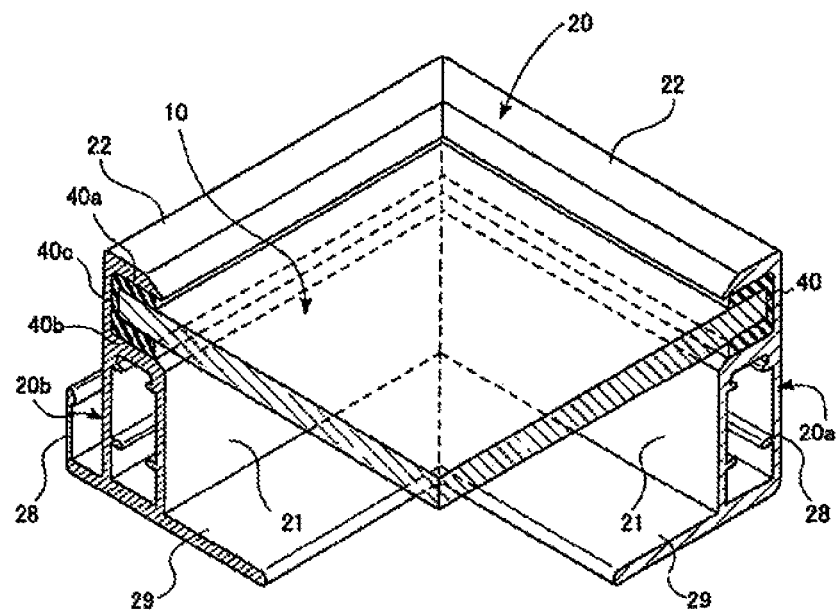
FIG. 2 is a perspective view showing the solar cell module according to the first embodiment.
Figure 3:
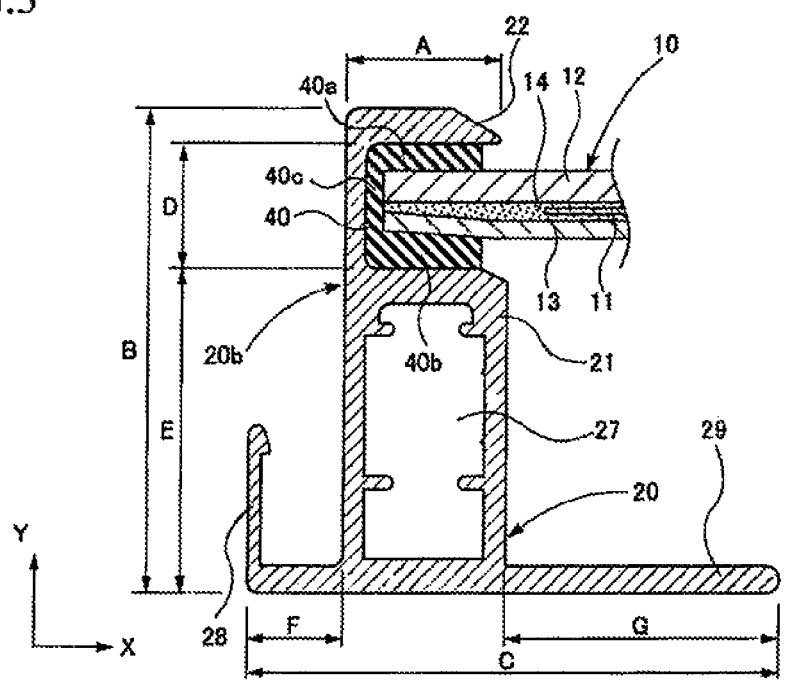
FIG. 3 is a cross-sectional view showing apart of the solar cell module according to the first embodiment.

Solar cell panel 10 is formed into a substantially rectangular shape in a plan view. As shown in FIGS. 1 to 3, in solar cell panel 10, solar cells 11 are electrically connected to one another by using interconnection members 102 made of a conductive material such as a copper foil, and are sealed between transparent front surface member 12 and weather resistant back surface member 13 by using transparent sealing material 14. As sealing material 14, EVA or the like having excellent weather resistance and moisture resistance is used, for example.

In addition, solar cells 11 connected in series by using interconnection members 102 form string 110 which is a unit of solar cells 11. In the example shown in FIG. 1, twelve solar cells 11 connected in series form string 110. Adjacent strings 110 are connected to each other by using wirings for connection which are so-called transmission wiring members 111. Further, lead wires 112 configured to extract output from solar cells 11 to the outside are provided, and thus between lead wires 112 solar cells 11 are connected in series.

Each of solar cells 11 described above is formed by, for example, a crystal system semiconductor formed of single-crystal silicon, polycrystalline silicon or the like having a thickness of approximately 0.15 mm, and are shaped into a substantially square with approximately 100 mm sides. However, the material and the shape of solar cells 11 are not limited thereto, and other solar cells may be used.

Each solar cell 11 includes an n-type region and a p-type region. A junction is formed at an interface between the n-type region and the p-type region. At the junction, an electric field is generated to separate carriers generated by photoelectric conversion. For example, a solar cell is used which has a structure of a single-crystal silicon substrate and an amorphous silicon layer formed as an n-type region and a p-type region, respectively. Alternatively, a solar cell having the following structure may also be used. Specifically, a solar cell having a substantially intrinsic amorphous silicon layer sandwiched between the single-crystal silicon substrate and the amorphous silicon layer can reduce a defect at the interface to improve the characteristic of a hetero-junction interface. Still alternatively, solar cell 11 may also be a back contact type solar cell having an n-type region and a p-type region in a surface opposite from a light-receiving surface.

Front surface member 12 is an optically transparent plate allowing light to enter solar cells 11. For example, a glass plate such as super white glass, tempered glass or heat reflecting glass, or a synthetic resin plate such as a polycarbonate resin is used as front surface member 12.

Back surface member 13 is a weather resistant film. For example, polyvinylfluoride (PVF), polyethylene terephthalate (PET) or polyethylene naphthalate (PEN), a material obtained by laminating these, a PET film formed by laminating films with an aluminum foil sandwiched in between, or the like is used as back surface member 13. As occasion demands, a terminal box (not shown) is provided, for example, on back surface member 13.

In the first embodiment, insulating packing 40 covers the peripheral edge portion of solar cell panel 10 and is fitted in frame 20 made of a metal such as an aluminum material.

A material forming packing 40 is selected from insulating resin materials having a buffer action. For example, various rubbers may be used, such as ethylene-propylene-diene rubber (EPDM), ethylene-propylene rubber, ethylene-propylene terpolymer, silicone rubber, polyurethane rubber, polyamide rubber, natural rubber, polyisobutylene, polyisoprene, chloroprene rubber, butyl rubber, nitrile butyl rubber, styrene-butadiene rubber, styrene-butadiene-styrene rubber, styrene-isoprene-styrene rubber, styrene-ethylene-butadiene rubber, styrene-ethylene-butylene-styrene rubber, styrene-isoprene-propylene-styrene rubber, and acrylic rubber.

As shown in FIGS. 2 and 3, first frames 20a and second frames 20b included in frame 20 are made of, for example, aluminum, iron or stainless steel, and are manufactured by extrusion or the like. In this embodiment, first frames 20a and second frames 20b are manufactured by extruding aluminum. First and second frames 20a and 20b described above each include hollow main body portion 21 and fitting portion 22 which is located above main body portion 21. Fitting portion 22 has a C-shaped cross section and is to be fitted around solar cell panel 10.

First and second frames 20a and 20b are provided with rectangular-shaped attachment portions 27 in their end portions. Corner pieces (not shown) for fixing first frames 20a and second frames 20b are inserted in attachment portions 27. Each second frame 20b on the long side of frame 20 is provided with flange portion 28 protruding from the bottom of second frame 20b toward the outside of solar cell panel 10. Flange portion 28 protrudes outward from the bottom of second frame 20b and further extends upward.

The corner pieces to be inserted into attachment portions 27 are made of an aluminum alloy.

One end of each corner piece is inserted into a corresponding one of attachment portions 27 of second frame 20b (20a) to fix the corner piece. Thereafter, the other end of the corner piece is inserted into a corresponding one of attachment portions 27 of first frame 20a (20b) to fix first and second frames 20a and 20b.

As shown in FIGS. 2 and 3, packing 40 is formed in such a manner as to have a substantially C-shaped cross-section and to extend linearly in the longitudinal direction. Packing 40 includes front surface portion 40a located on the front surface side of packing 40, back surface portion 40b located on the back surface side, and side surface portion 40c in contact with side surfaces of solar cell panel 10. What is required for the thickness of packing 40 is to be thick enough to ensure insulation between solar cell panel 10 and frame 20. Front surface portion 40a, back surface portion 40b, and side surface portion 40c have thicknesses between 0.5 mm and 2 mm, for example.

In order to increase the second moment of area of frame 20, inner flange portions 29 extending inward with respect to solar cell panel 10 are provided to bottom portions of first and second frames 20a and 20b, respectively, in the first embodiment. The width of each inner flange portion 29 is determined based on the second moment of area required for frame 20, and is preferably 19 mm or larger. In the first embodiment, the width is set to be about 20 mm.

The dimensions of second frame 20b in the first embodiment are described below. As shown in FIG. 3, the width of upper surface portion (A) of each fitting portion 22 is 11.3 mm, height (D) of fitting portion 22 is 9 mm, height (E) of main body portion 21 is 23.5 mm, overall height (B) of second frame 20b is 35 mm, width (F) of each flange portion 28 is 7 mm, width (G) of inner flange portion 29 is 20.5 mm, and length (C) from flange portion 28 to an edge of inner flange portion 29 is 38.8 mm. In this configuration, the second moment of area in an X axis direction is 0.24 cm4, and the second moment of area in a Y axis direction is 1.66 cm4.

Figure 11:
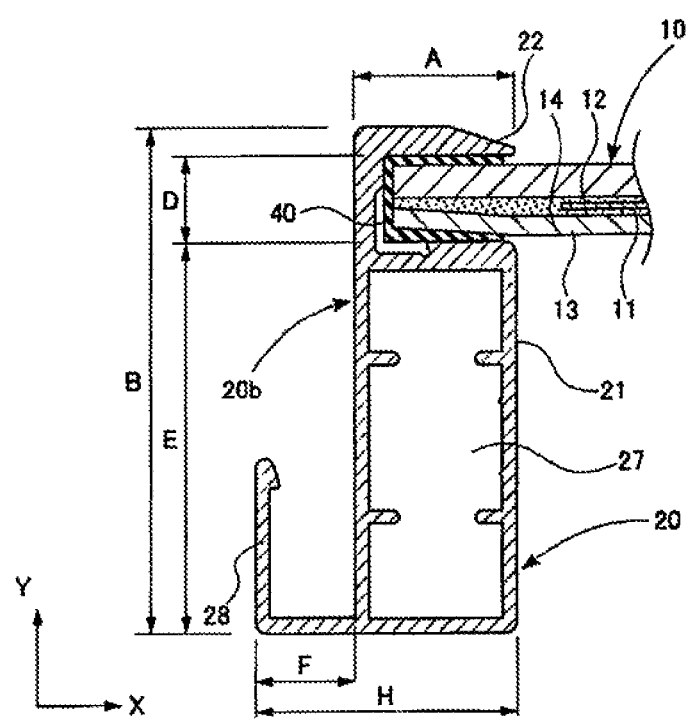
FIG. 11 is a cross-sectional view showing a part of the conventional solar cell module.

On the other hand, the dimensions of the conventional frame without an inner flange portion are described below, as shown in FIG. 11. The width of upper surface portion (A) of each fitting portion 22 is 11.3 mm, height (D) of fitting portion 22 is 6 mm, height (E) of main body portion 21 is 27 mm, overall height (B) of second frame 20b is 35 mm, width (F) of each flange portion 28 is 7 mm, and length (H) from flange portion 28 to an end of main body portion 21 is 18.3 mm. In this configuration, the second moment of area in the X axis direction is 1.76 cm4, and the second moment of area in the Y axis direction is 0.38 cm4.

As described above, the second moment of area of frame 20 is larger than that of conventional frame 20. Consequently, the displacement amount of frame 20 can be reduced. For example, also when frame 20 is lifted in a direction of the arrow in FIG. 1 with the central portion of second frame 20b on the long side held, the displacement amount can be reduced.

For each of frame 20 according to the first embodiment which is used for solar cell module 1 shown in FIGS. 1 to 3 and conventional frame 20 which is used for solar cell module 1 shown in FIG. 11, the amount of displacement occurring when the central portion of second frame 20b on the long side is held is calculated.

Figure 5:
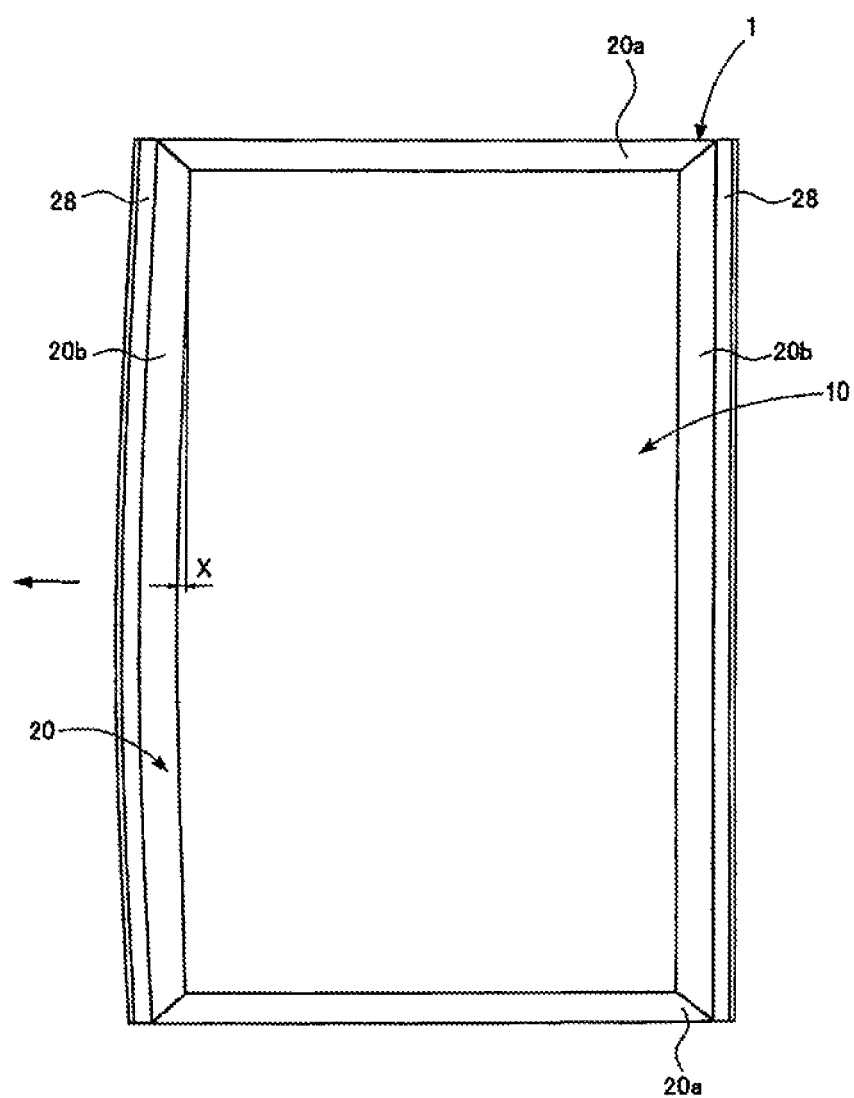
FIG. 5 is a schematic plan view showing deformation of a frame of the solar cell module according to the first embodiment.

FIG. 5 shows a case where the central portion of second frame 20b in solar cell module 1 is held. The weight of solar cell module 1 is applied in a direction of the arrow in FIG. 5. When the weight of solar cell module 1 is about 14 kg, displace amount X is 5 mm. Note that illustration of solar cells 11 and the like are omitted in FIG. 5.

Figure 12:
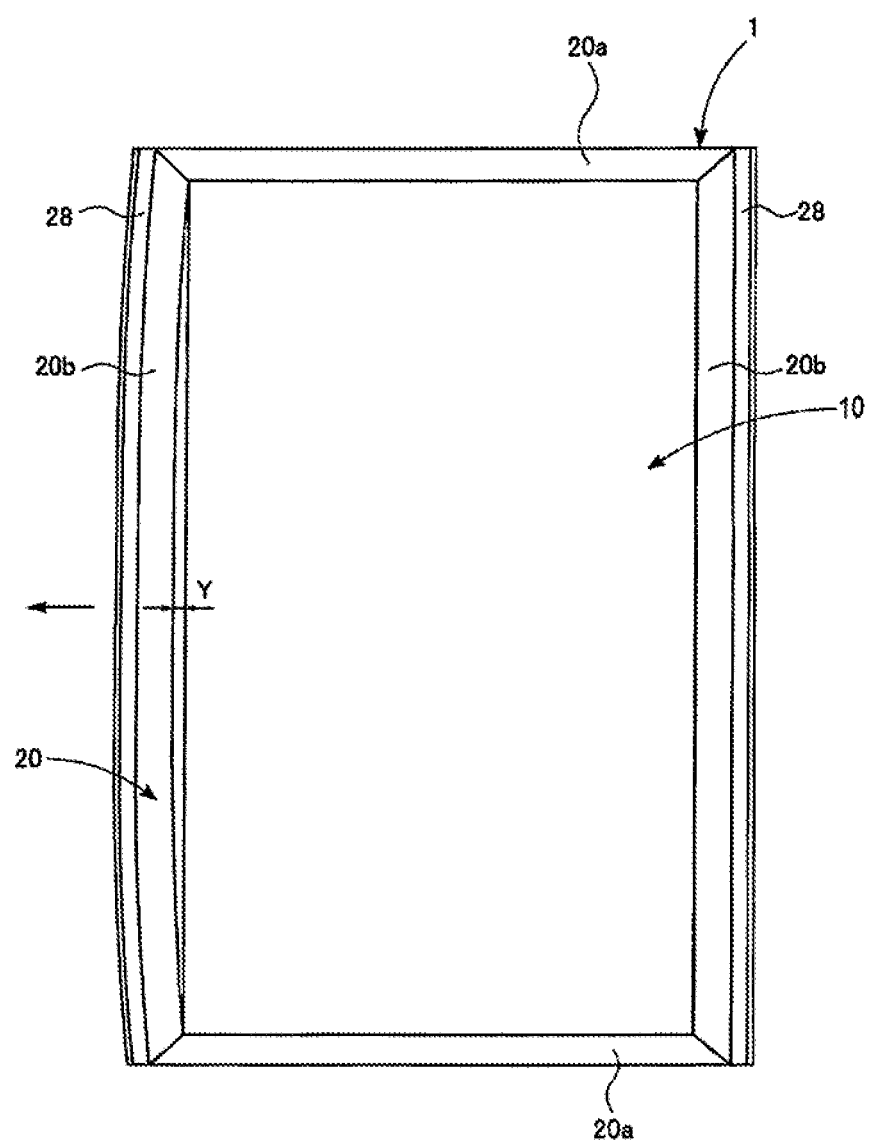
FIG. 12 is a schematic plan view showing deformation of a frame of the conventional solar cell module.

Likewise, when the weight of solar cell module 1 is applied to the central portion of second frame 20b in conventional solar cell module 1 as shown in FIG. 12, displacement amount Y is 21 mm.

As described above, according to this embodiment, an increase of the second moment of area reduces a displacement amount, and thus it is possible to prevent solar cell panel 10 from falling off frame 20.

Moreover, the second moment of area is increased also in the Y axis direction. Thus, even though solar cell panel 10 receives a pressure such as a wind pressure from the light-receiving side, the frame deformation can be prevented.

A description is given of a method of assembling solar cell module 1 of this embodiment.

Figure 4:
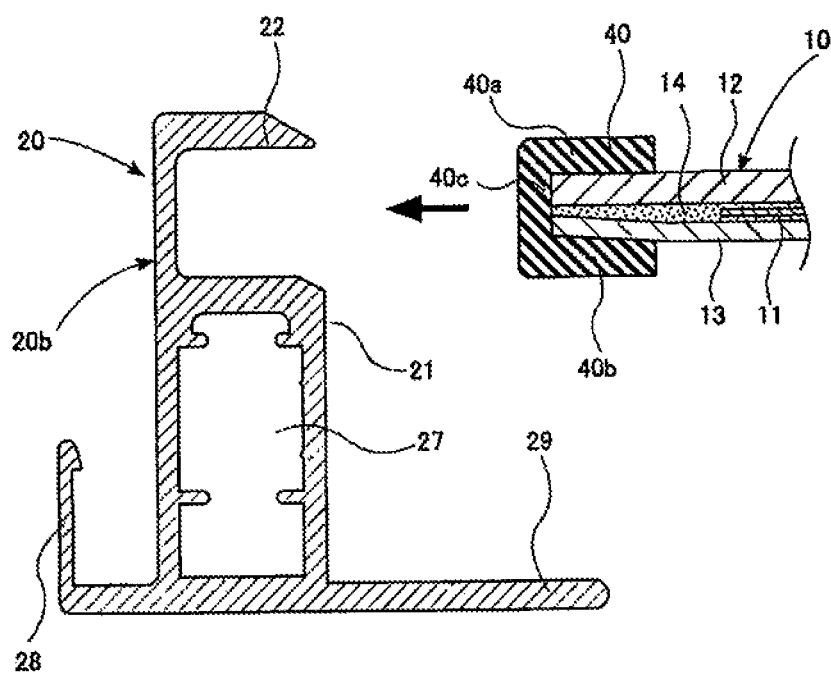
FIG. 4 is a cross-sectional view showing a method of assembling the solar cell module according to the first embodiment.

As shown in FIG. 4, the peripheral edge portion of solar cell panel 10 is fitted in packing 40. Then, solar cell panel 10 with packing 40 attached thereto is inserted into fitting portions 22 of frame 20 (20b). Likewise, solar cell panel 10 with packing 40 attached thereto is inserted into fitting portions 22 of frame 20 (20a).

Thereby, packing 40 is held in fitting portions 22 of frame 20, the peripheral edge portion of solar cell panel 10 is fixed in frame 20 with packing 40 placed between each fitting portion 22 and the peripheral edge portion.

Here, when frame 20 supports packing 40, packing 40 is preferably compressed at a predetermined percentage of the original volume thereof. For example, packing 40 is preferably compressed at 10% by volume to 90% by volume, and preferably 20% by volume to 80% by volume.

Since packing 40 acts as a buffer layer, it can be ensured that solar cell panel 10 is favorably fixed in frame 20. Moreover, since the increase of the second moment of area reduces the displacement amount, it is possible to prevent frame 20 from being deformed and solar cell panel 10 from falling off frame 20.

Further, since voltage endurance of packing 40 leads to excellent voltage endurance of solar cell module 1, highly durable solar cell module 1 can be obtained.

Next, a second embodiment is described with reference to FIG. 6. Note that the same components as those in the first embodiment are denoted by the same reference numerals, and a description thereof is omitted to avoid duplicate description.

Figure 6:
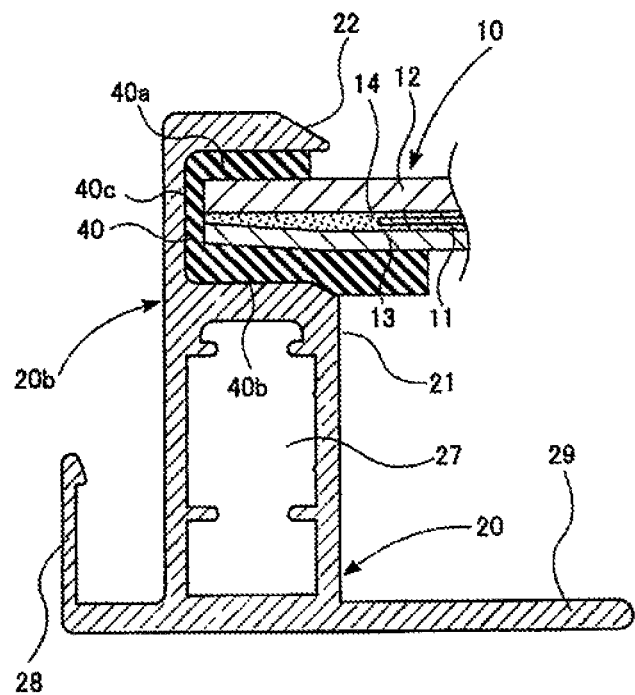
FIG. 6 is a cross-sectional view showing a part of a solar cell module according to a second embodiment.

As shown in FIG. 6, in the second embodiment, back surface portion 40b of packing 40 arranged on the back surface member 13 side is formed to extend farther in an inward direction from the peripheral end portion of solar cell panel 10 than front surface portion 40a of packing 40 arranged on the front surface member 12 side. Specifically, back surface portion 40b of packing 40 arranged on the back surface member 13 side is formed to be, for example, 1 mm to 30 mm, preferably 10 mm to 20 mm longer than front surface portion 40a of packing 40 arranged on the front surface member 12 side. As described above, by forming back surface portion 40b to be longer, insulation between solar cells 11 and frame 20 is enhanced.

Figure 7:
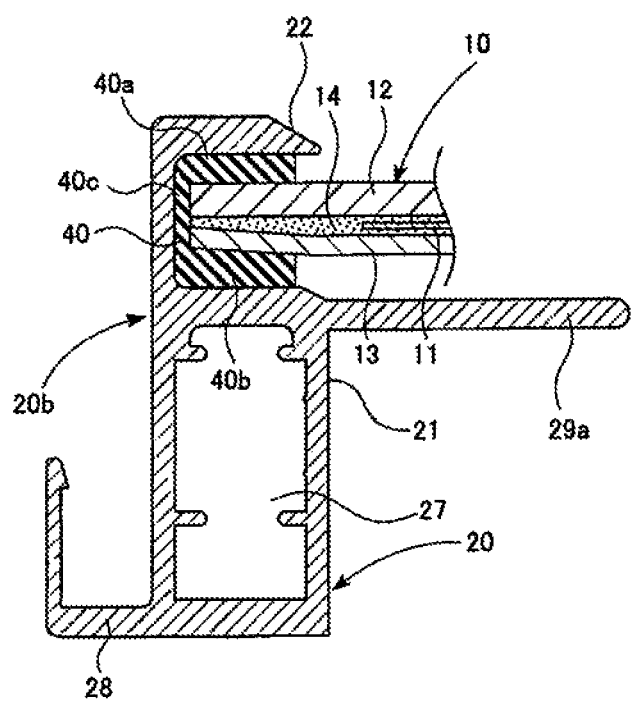
FIG. 7 is a cross-sectional view showing a part of a solar cell module according to a third embodiment.

Next, a third embodiment of the invention is described with reference to FIG. 7. Note that the same components as those in the first embodiment are denoted by the same reference numerals, and a description thereof is omitted to avoid duplicate description.

In the third embodiment, inner flange portions 29a are provided at an upper portion of main body portions 21 and near fitting portions 22. As described above, even if inner flange portions 29a are provided at the upper portion of main body portions 21, the second moment of area can be enhanced. The length of inner flange portions 29a is set to be the same as the length of inner flange portions 29 in the first embodiment, and the other dimensions of frame 20 are the same as those in the first embodiment. In this configuration, the second moments of area in the X and Y axis directions are 2.54 cm4 and 1.66 cm4, respectively.

As described above, even if inner flange portions 29a are provided at the upper portion of main body portions 21, the second moment of area in the Y axis direction is substantially the same as in the first embodiment. Accordingly, an amount of displacement of second frame 20b at the time of lifting the central portion of frame 20 is 5 mm as in the first embodiment.

Figure 9:
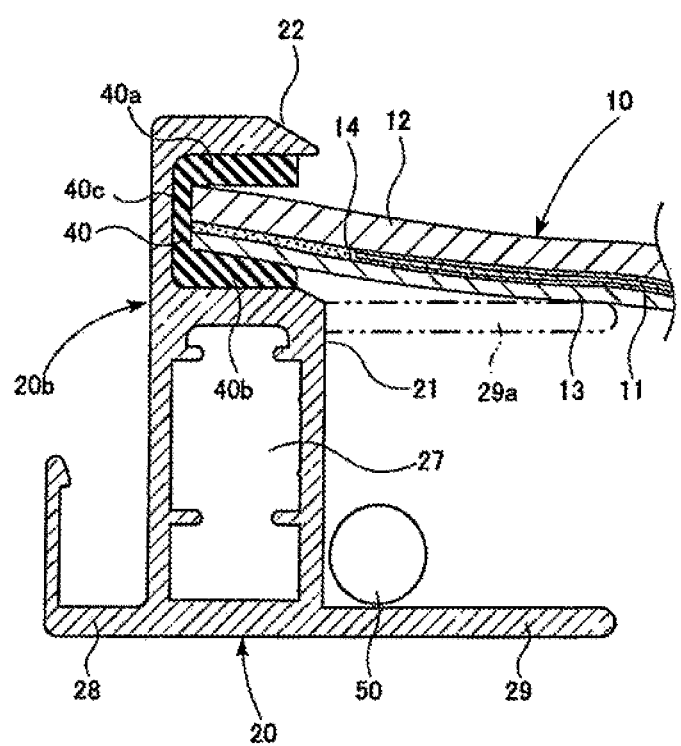
FIG. 9 is a cross-sectional view showing a state where the solar cell panel in the solar cell module according to each embodiment is deformed.
Figure 10:
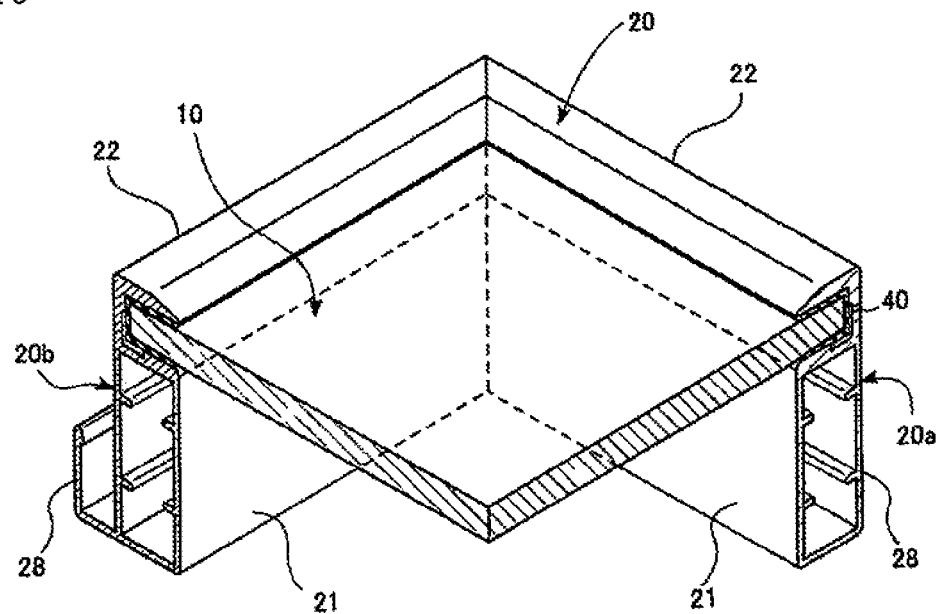
FIG. 10 is a perspective view showing a conventional solar cell module.

As shown in FIG. 9, in the structure where inner flange portions 29a are provided at the upper portion of main body portions 21 of frame 20, solar cell panel 10 bent due to a positive pressure (a wind pressure from the light-receiving side) might come into contact with any one of inner flange portions 29a.

In contrast, in the structure where inner flange portions 29 are provided at the lower portion of main body portions 21, solar cell panel 10 does not cause the contact even in spite of displacement. For this reason, each inner flange portion 29 is preferably provided to corresponding main body portion 21 to be a certain distance away from solar cell panel 10.

Moreover, in the structure where inner flange portion 29 is provided at the lower portion of main body portion 21, cables connecting solar cell modules can be arranged on the inner side of inner flange portion 29. Further, since inner flange portion 29 is located at the lower portion of main body portion 21, frame 20 can be held easily. Thus, workability in installing solar cell module 1 is enhanced. Still further, by providing a hole in inner flange portion 29, wiring for electrical grounding can be performed in a simple manner.

In view of enhancement of the second moment of area of a frame, the position of an inner flange portion is not limited to those in the first and third embodiments, and may be determined as appropriate based on a mode of use.

Next, a fourth embodiment is described with reference to FIG. 8. Note that the same components as those in the third embodiment are denoted by the same reference numerals, and a description thereof is omitted to avoid duplicate description.

Figure 8:
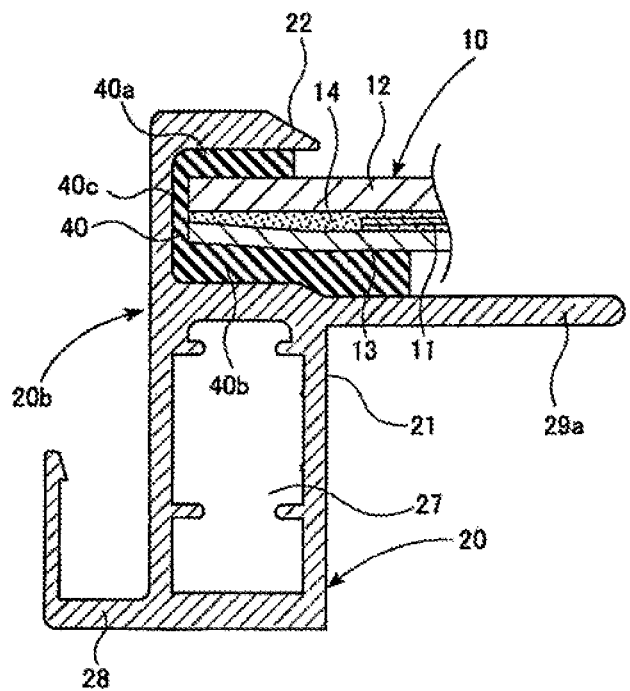
FIG. 8 is a cross-sectional view showing a part of a solar cell module according to a fourth embodiment.

As shown in FIG. 8, in the fourth embodiment, as in the third embodiment, inner flange portions 29a are provided at the upper portion of main body portions 21 and near fitting portions 22. Further, in the fourth embodiment, as in the second embodiment, back surface portion 40b of packing 40 arranged on the back surface member 13 side is formed longer in the inward direction from the peripheral end portion of solar cell panel 10 than front surface portion 40a of packing 40 arranged on the front surface member 12 side. As described above, by forming back surface portion 40b to be longer, insulation between solar cell panel 10 and frame 20 is further enhanced.

Note that in each embodiment described above, the part of solar cell module 1 which is in one of second frames 20b on the long sides of frame 20 is shown by using the cross-sectional view. Although being not shown in the cross-sectional view, first frames 20a on the short sides have the same structure as that of second frames 20b on the long sides, except flange portions 28. In addition, although inner flange portions 29 are respectively provided to first frames 20a on the short sides and second frames 20b on the long sides in each embodiment described above, a structure may be employed in which inner flange portions 29 are provided to only second frames 20b on the long sides which are to have a larger displacement amount.

The embodiments disclosed this time are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

What is claimed is:

1. A solar cell module comprising:
a solar cell panel including solar cells sealed between a front surface member and a back surface member with a sealing material, the solar cell panel being rectangular in shape and having a pair of short sides and a pair of long sides;
a frame supporting a peripheral edge portion of the solar cell panel; and
packing made of an insulating resin material, wherein
the frame comprising a pair of first frame members supporting the pair of short sides of the solar cell panel, and the frame includes a pair of second frame members supporting the pair of long sides of the solar cell panel, wherein
each of the first frame members includes:
a first main body portion having a rectangular-shaped hollow structure in a cross section taken along a direction orthogonal to a longitudinal direction of the first frame member;
a first fitting portion that is located above the first main body portion and in which the peripheral edge portion of the solar cell panel is fitted via the packing; and
a first inner flange portion extending from a bottom portion of the first main body portion toward a center of the solar cell module parallel to a front surface of the solar cell panel,
each of the second frame members includes:
a second main body portion having a rectangular-shaped hollow structure in a cross section along a direction orthogonal to a longitudinal direction of the second frame member;
a second fitting portion that is located above the second main body portion and in which the peripheral edge portion of the solar cell panel is fitted via the packing; and
a second inner flange portion extending from a bottom portion of the second main body portion toward the center of the solar cell module parallel to the front surface of the solar cell panel,
the bottom portion of the first main body portion being common to a bottom portion of the first frame member, the bottom portion of the second main body portion being common to a bottom portion of the second frame member,
the first fitting portion is composed of:
a lower portion of the first fitting portion that comprises an upper surface portion of the first main body portion that is located under the solar cell panel;
a side surface portion opposed to the peripheral edge portion of the solar cell panel; and
an upper portion located above the solar cell panel,
the second fitting portion is composed of:
a lower portion of the second fitting portion that comprises an upper surface portion of the second main body portion that is located under the solar cell panel;
a side surface portion opposed to the peripheral edge portion of the solar cell panel; and
an upper portion located above the solar cell panel,
an end face of the first main body portion, an end face of the first fitting portion, and an end face of the first inner flange portion of the first frame members are respectively in engagement with an end face of the second main body portion, an end face of the second fitting portion, and an end face of the second inner flange portion of the second frame members,
the upper surface portions of the first main body portion and the second main body portion that respectively face the bottom portions of the first main body portion and the second main body portion do not have flange portions that respectively extend from the upper surface portions of the first main body portion and the second main body portion toward the center of the solar cell module parallel to the front surface of the solar cell panel, the packing is compressed at a predetermined percentage of an original volume thereof, and a back surface portion of the packing in contact with a back surface of the solar cell panel is longer than a front surface portion of the packing in contact with the front surface of the solar cell panel toward the center of the solar cell module from the peripheral edge portion of the solar cell panel, wherein the back surface portion of the packing in contact with the back surface of the solar cell panel overlaps with a solar cell of the solar cell panel in a plan view of the solar cell panel.

2. The solar cell module according to claim 1, wherein the second inner flange portion extends in a same plane as the bottom portion of the second main body portion.

3. The solar cell module according to claim 1, wherein first ends of the first inner flange portion and the second inner flange portion are in contact with the first and second main body portions, respectively, and wherein second ends of the first and second inner flange portions furthest away from the first and second main body portions are not in direct contact with any part of the first and second main body portions.

4. The solar cell module according to claim 1, wherein the rectangular-shaped hollow structure of each of the first and second main body portions is defined by side wall portions parallel to each other, the upper surface portion connecting upper ends of the side wall portions, the bottom portion connecting lower ends of the side wall portions, and four protruding portions protruding from the side wall portions within the rectangular-shaped hollow structure.

5. The solar cell module according to claim 1, wherein each of the first and second inner flange portions has a width of 19 mm or larger in the direction parallel to the front surface of the solar cell panel.

6. The solar cell module according to claim 1, wherein the packing is compressed 20% to 80% by volume.

7. The solar cell module according to claim 1, wherein as seen in the plan view of the solar cell panel, the peripheral edge portion of the solar cell panel overlaps with the first and second main body portions.

8. The solar cell module according to claim 1, wherein each of the first and second main body portions has a single hollow structure.

9. The solar cell module according to claim 1, further comprising:

a first outer flange portion fixed to the bottom portion of the first main body portion and extends away from the center of the solar cell module parallel to the front surface of the solar cell panel; and a second outer flange portion fixed to the bottom portion of the second main body portion and extends away from the center of the solar cell module parallel to the front surface of the solar cell panel.

* * * * *